(12) United States Patent
Harima et al.

(10) Patent No.: US 7,764,138 B2
(45) Date of Patent: Jul. 27, 2010

(54) QUARTZ CRYSTAL DEVICE INCLUDING MONITOR ELECTRODE

(75) Inventors: Hidenori Harima, Sayama (JP); Kouichi Moriya, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 45 days.

(21) Appl. No.: 12/203,356

(22) Filed: Sep. 3, 2008

(65) Prior Publication Data

US 2009/0066426 A1    Mar. 12, 2009

(30) Foreign Application Priority Data

Sep. 6, 2007    (JP) .............................. 2007-231368

(51) Int. Cl.
*H03B 5/32* (2006.01)
(52) U.S. Cl. ......................................... 331/158; 331/68
(58) Field of Classification Search .................... 331/68, 331/158
See application file for complete search history.

(56) References Cited

U.S. PATENT DOCUMENTS

2004/0085147 A1* 5/2004 Harima et al. ............... 331/158
2004/0178858 A1 9/2004 Miyazki et al.
2007/0075796 A1 4/2007 Mizumura et al.
2007/0247030 A1 10/2007 Naruse

FOREIGN PATENT DOCUMENTS

| EP | 0 831 591 A1 | 3/1998 |
| JP | 2000-49560 A | 2/2000 |
| JP | 2003-298000 A | 10/2003 |
| JP | 2004-88533 A | 3/2004 |
| JP | 2005-268257 A | 9/2005 |
| WO | WO 2006/095503 A1 | 9/2006 |

* cited by examiner

*Primary Examiner*—Joseph Chang
(74) *Attorney, Agent, or Firm*—Knobbe Martens Olson & Bear LLP (57) ABSTRACT

A quartz crystal device includes: a crystal unit in which a crystal blank is hermetically encapsulated; and a mounting substrate housing an IC chip on which a circuit using the crystal blank is integrated. By joining an external terminal of the crystal unit and a bonding terminal of the mounting substrate, the mounting substrate is joined to the crystal unit to be integrated, and the quartz crystal device is configured. In the quartz crystal device, a crystal monitor terminal electrically connected to the bonding terminal is provided on an outer side surface of the mounting substrate, and even in a state in which the crystal unit and the mounting terminal are integrated, a vibration characteristic of the crystal blank is measurable by using the crystal monitor terminal.

9 Claims, 8 Drawing Sheets

QUARTZ CRYSTAL DEVICE INCLUDING MONITOR ELECTRODE

BACKGROUND OF THE INVENTION

1. Field of the Invention

The present invention relates to a quartz crystal device having a configuration in which a quartz crystal unit and an IC (integrated circuit) chip including a circuit using the crystal unit are integrated, and particularly relates to a quartz crystal device provided with a monitor electrode for inspecting characteristics of a crystal blank used in the crystal element from outside.

2. Description of the Related Art

As a typical quartz crystal device in which a quartz crystal unit and an IC chip are integrated, there is a surface-mount oscillator in which a crystal unit and an IC chip on which an oscillating circuit using the crystal unit are integrated. Surface-mount crystal oscillators are widely incorporated especially in portable electronic apparatuses such as portable telephones, for example, as reference sources for frequency and time because of their compactness and light weight.

Figure 1A:
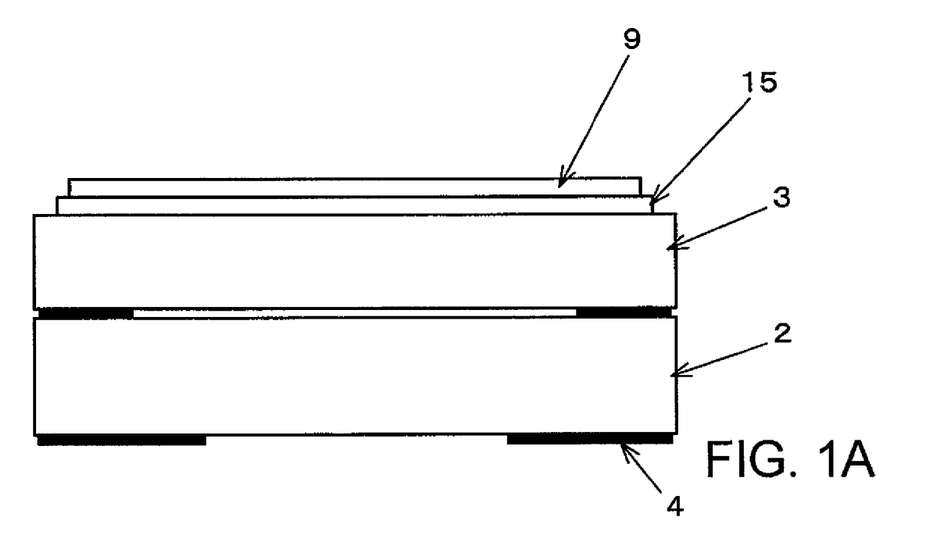
FIGS. 1A and 1B are a side view and an assembled sectional view, respectively, showing one example of a configuration of a conventional bonding type surface-mount crystal oscillator.
Figure 1B:
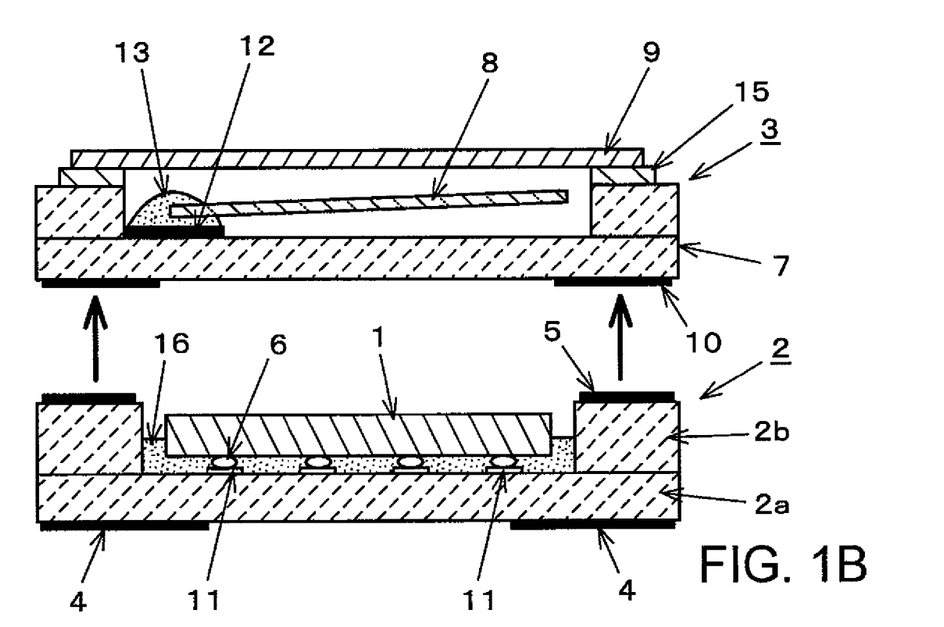
Figure 2A:
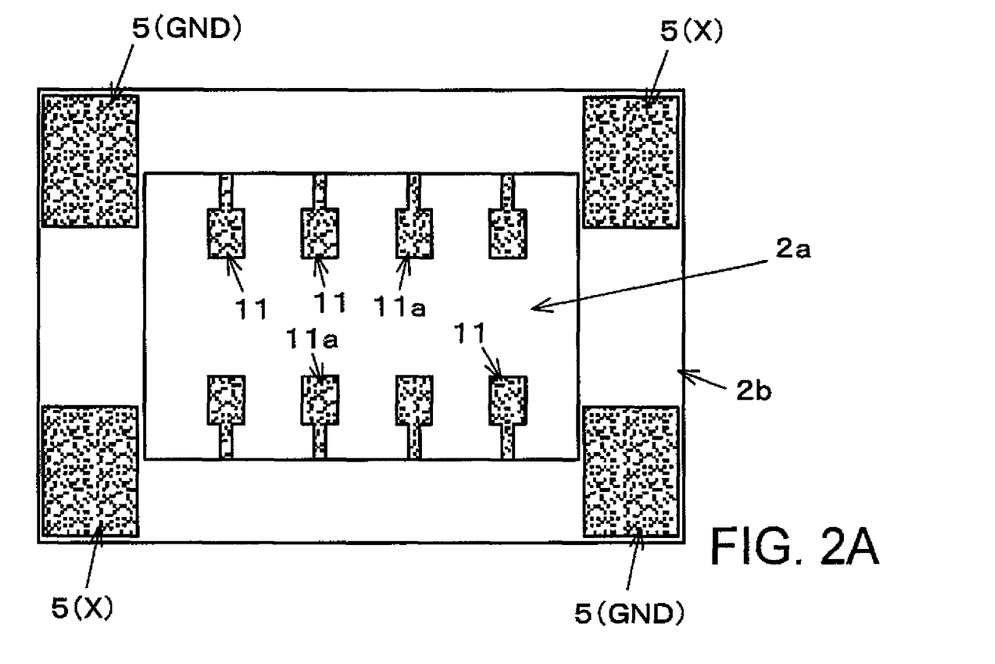
FIG. 2A is a top view of a mounting substrate in the crystal oscillator shown in FIGS. 1A and 1B.
Figure 2B:
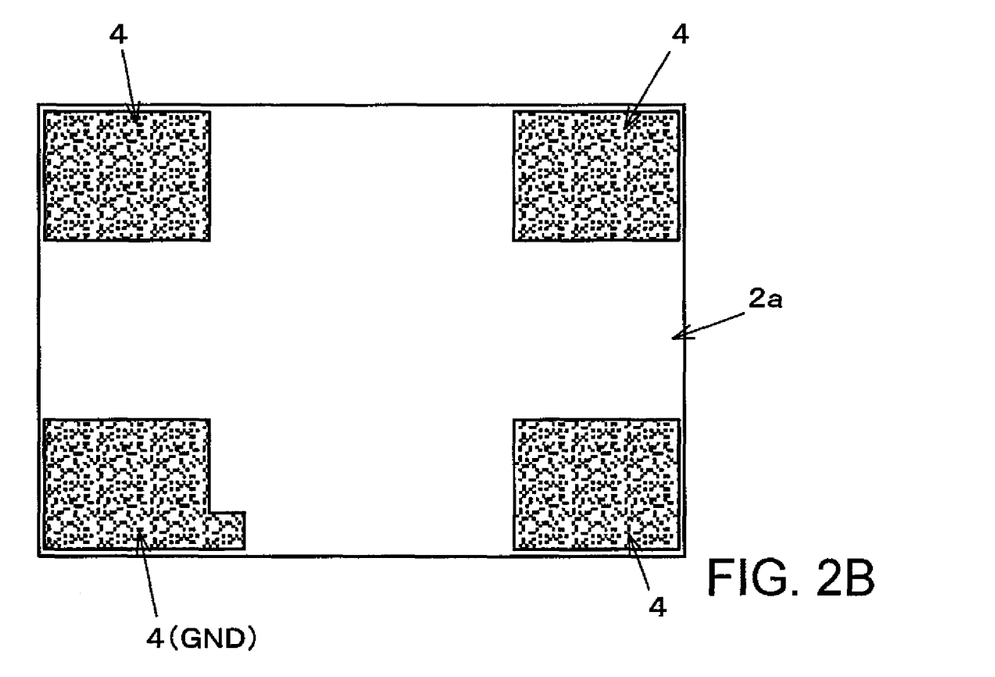
FIG. 2B is a bottom view of the mounting substrate in the crystal oscillator shown in FIGS. 1A and 1B.
Figure 3:
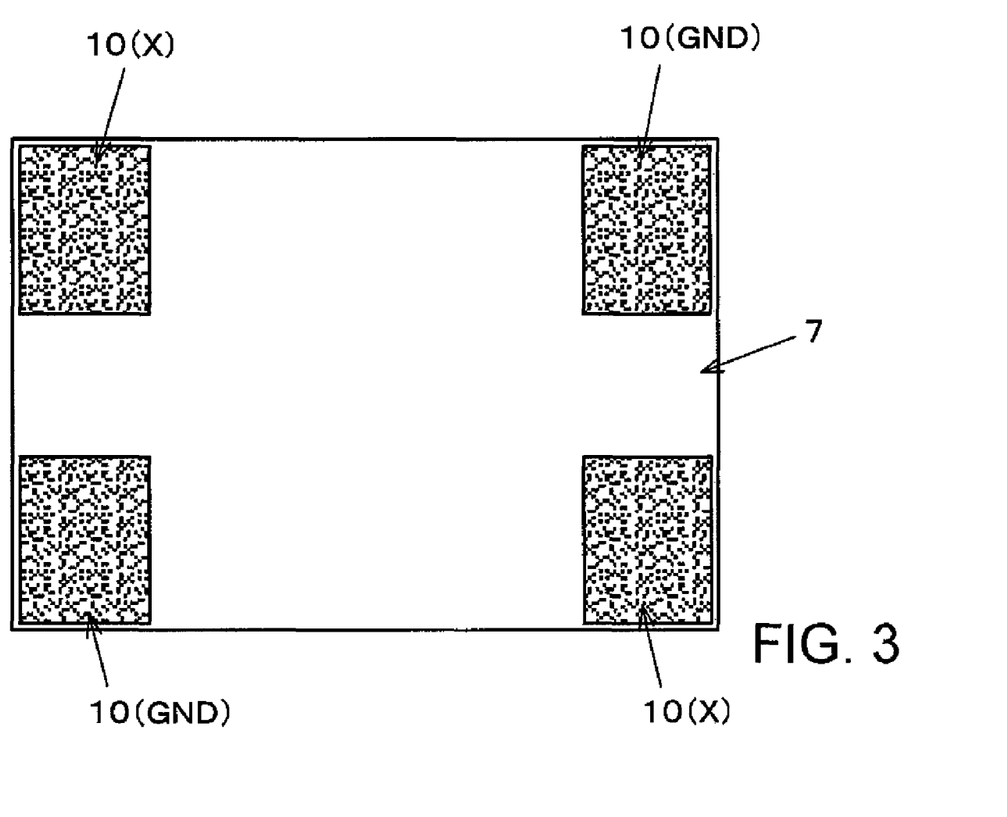
FIG. 3 is a bottom view of a crystal unit in the crystal oscillator shown in FIGS. 1A and 1B.

As one type of such a surface-mount crystal oscillator, there is a bonding type surface-mount crystal oscillator in which an IC chip and a quartz crystal blank are respectively housed in separate containers and thereafter, the containers are joined to be integrated, as disclosed in Japanese Patent Laid-Open No. 2004-88533 (JP-A-2004-088533). FIG. 1A is a side view showing one example of a configuration of a conventional bonding type surface-mount crystal oscillator. FIG. 1B is an assembled sectional view of the crystal oscillator. FIGS. 2A and 2B are respectively a top view and a bottom view of a mounting substrate for use in the crystal oscillator. FIG. 3 is a bottom view of a crystal unit in the crystal oscillator.

The illustrated crystal oscillator includes mounting substrate 2 housing IC chip 1, and crystal unit 3 in which crystal blank 8 is hermetically encapsulated, in which mounting substrate 2 is joined to a bottom surface of crystal unit 3 Mounting substrate 2 is a planar member with a substantially rectangular plane shape, and a recess for housing IC chip 1 is formed on one of principal surfaces of mounting substrate 2.

Mounting substrate 2 is configured by laminated ceramics constituted of planar bottom wall layer 2a in a substantially rectangular shape, and frame wall layer 2b provided on bottom wall layer 2a in a frame shape, and a side wall of the recess of mounting substrate 2 is formed by frame wall layer 2. At four corner portions on a top surface of frame wall layer 2b, that is, the four corner portions of an opening end surface surrounding the recess of mounting substrate 2, bonding terminals 5 for electrically and mechanically joining mounting substrate 2 to the bottom surface of crystal unit 3 are formed. Mounting terminals 4 which are used when the crystal oscillator is surface-mounted on a wiring board are provided at four corner portions of an undersurface illustrated in the drawing of bottom wall layer 2a, that is, an outer bottom surface of mounting substrate 2.

IC chip 1 has a substantially rectangular shape, in which electronic circuits including at least an oscillating circuit using crystal unit 3 are integrated on a semiconductor substrate. In IC chip 1, the electronic circuits such as the oscillating circuit are formed on one principal surface of the semiconductor substrate by an ordinary semiconductor device fabricating process, and therefore, of a pair of principal surfaces of the semiconductor substrate, the principal surface on which the electronic circuits are formed will be called a circuit formation surface of the IC chip. A plurality of IC terminals for connecting IC chip 1 to an external circuit are also formed on the circuit formation surface. The IC terminals include a power supply terminal, a ground terminal, an oscillation output terminal, an AFC (automatic frequency control) terminal, a pair of crystal connection terminals for connecting to the crystal oscillator, and the like.

Circuit terminals 11 are provided on a bottom surface of the recess of mounting substrate 2, that is, an exposure surface of bottom wall layer 2a by the recess to correspond to the IC terminals. The circuit terminals corresponding to the IC terminals, which are the power supply terminal, the ground terminal, the oscillation output terminal and the AFC terminal, are electrically connected to mounting terminals 4 respectively through conductive paths (not shown) formed in mounting substrate 2. The circuit terminals corresponding to a pair of crystal connection terminals of IC chip 2 are electrically connected to bonding terminals 5(X) at both ends of one diagonal line of mounting substrate 2, for example, through conductive paths (not shown). Remaining two bonding terminals 5(GND) are electrically connected to ground terminals 4(GND) out of mounting terminals 4 via through-holes provided in mounting substrate 2, for example.

IC chip 1 is fixed to the inner bottom surface of the recess of mounting substrate 2 by causing the circuit formation surface to face the inner bottom surface of the recess of mounting substrate 2, and electrically and mechanically connecting the IC terminals to circuit terminals 11 by ultrasonic thermo-compression bonding using bumps 6. In order to protect the circuit formation surface of IC chip 1, protection resin layer 16 is provided in the recess of mounting substrate 2 as so-called underfill so as to bury a space between the inner bottom surface of the recess and the circuit formation surface.

Meanwhile, crystal unit 3 is such that crystal blank 8 is hermetically encapsulated in a recess of container body 7 by housing crystal blank 8 in container body 7, and joining metal cover 9 to an opening end surface surrounding the recess. Container body 7 is constituted of laminated ceramics having the recess. In the illustrated one, metal cover 9 is joined to a metal thick film or metal ring 15 provided at the opening end surface by seam welding or beam welding. External terminals 10 corresponding to bonding terminals 5 of mounting substrate 2 are provided at four corner portions of an outer bottom surface of container body 7. A pair of crystal holding terminals 12 for holding crystal blank 8 are provided on an inner bottom surface of the recess of container body 7.

Crystal blank 8 is, for example, a substantially rectangular AT-cut quartz crystal blank, in which excitation electrodes (not shown) are respectively provided on both of its principal surfaces, and from the excitation electrodes, lead electrodes (not shown) are extended to both sides of one end portion of crystal blank 8. By fixing both the sides of the one end portion of crystal blank 8 where the lead electrodes are extended with conductive adhesive 13 or the like to crystal holding terminals 12, crystal blank 8 is electrically and mechanically connected to crystal holding terminals 12, and held in the recess of container body 7.

In container body 7, a pair of crystal holding terminals 12 are electrically connected to a pair of external terminals 10(X) on one diagonal line in the outer bottom surface of container body 7 through conductive paths (not shown) formed in container body 7. External terminals 10(GND) on the other diagonal line in the outer bottom surface are electrically connected to metal cover 9 through via holes provided in container body 7.

By connecting bonding terminals 5 of mounting substrate 2 to external terminals 10 of crystal unit 3 by using solder or the like, mounting substrate 2 and crystal unit 3 are electrically and mechanically connected, and are completed as a surface-mounting crystal oscillator. At this time, crystal holding terminals 12 in crystal unit 3 are electrically connected to the IC terminals through external terminals 10(X), bonding terminals 5(X) and circuit terminals 11, and therefore, crystal blank 8 is electrically connected to the oscillating circuit in IC chip 1. Metal cover 9 is also electrically connected to ground terminal 4(GND) of the mounting terminals.

Such a bonding type surface-mount crystal oscillator is ultimately assembled by independently forming mounting substrate 2 loaded with IC chip 1 and crystal unit 3, and thereafter, joining both of them. On this occasion, before mounting substrate 2 is joined to the outer bottom surface of crystal unit 3, probes of a measuring apparatus are caused to abut on a pair of external terminals 10(X), which are formed on the outer bottom surface of container body 7 of crystal unit 3 and electrically connected to crystal blank 8, to measure a vibration characteristic and the like of crystal blank 8, and whether crystal unit 3 is good or not is determined. As the vibration characteristic, crystal impedance (CI) is generally measured. Here, when it is determined as a defective, crystal unit 3 is removed from the manufacturing process, and mounting substrate 2 is joined to only good crystal unit 3. Thereby, an expensive IC chip is not wasted, and productivity can be enhanced. Further, external terminals 10(X) are formed within the same plane, and probes can be caused to abut on a pair of external terminals 10(X) form one direction. Therefore, the operation efficiency of measurement of the vibration characteristic becomes high.

Figure 4A:
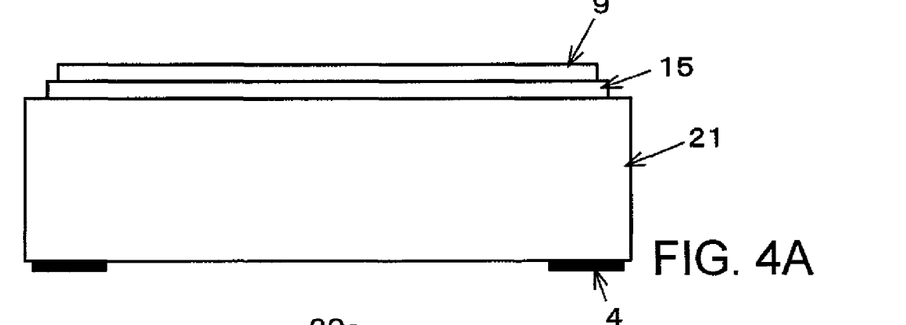
FIGS. 4A and 4B are a side view and an assembled sectional view, respectively, showing one example of a configuration of a conventional two-chamber type surface-mount crystal oscillator.
Figure 4B:
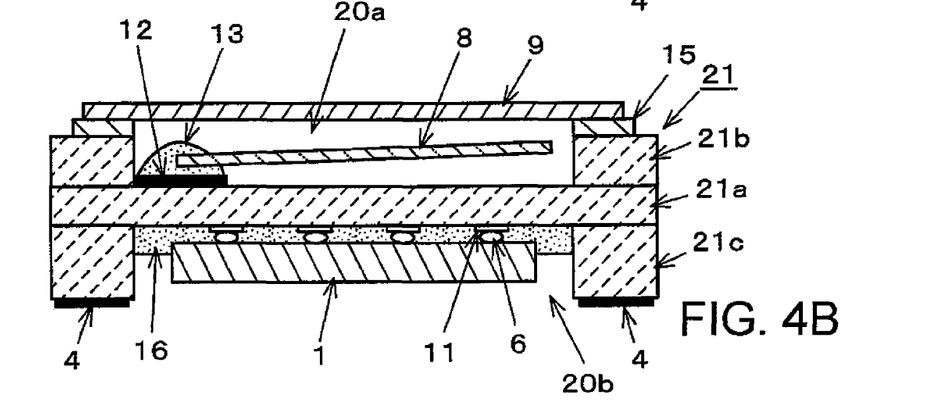
Figure 5:
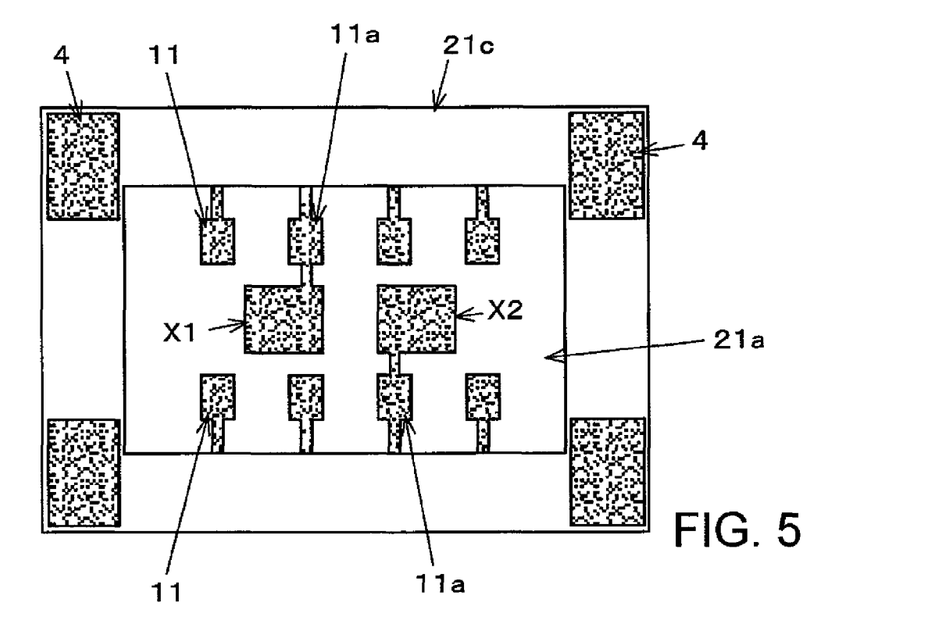
FIG. 5 is a bottom view of a container body in the crystal oscillator shown in FIGS. 4A and 4B with an IC chip removed.

As another type of a surface-mount crystal oscillator, there is a so-called. two-chamber type in which by using a container body with recesses formed respectively on both principal surfaces, a crystal blank is hermetically encapsulated in the recess of one principal surface to configure a crystal unit, and an IC chip is accommodated in the recess on the other principal surface. A two-chamber type surface-mount crystal oscillator is also called an H-shaped surface-mount crystal oscillator since a container body in which the sectional shape in a central portion is in a H-shape is used. FIG. 4A is a side view of such a two-chamber type surface-mount crystal oscillator. FIG. 4B is a sectional view of it. FIG. 5 is a bottom view of the container body with an IC chip removed. In these drawings, the same components as those in FIGS. 1A, 1B, 2A, 2B and 3 are assigned with the same reference numerals, and the redundant description of them will be omitted or simplified.

Container body 21 has a flat outer shape in a substantially rectangular parallelepiped shape which looks like a rectangle having short sides and long sides seen from above when mounted on a wiring board, and are provided with recesses on its top surface and undersurface respectively. As a result, container body 21 has an H-shaped sectional shape. Container body 21 is constituted of laminated ceramics having planar central layer 21a in a substantially rectangular shape, and upper and lower frame layers 21b and 21c respectively having rectangular openings. First recess 20a at an upper side illustrated in the drawing is formed by central layer 21a and frame layer 21b, and quartz crystal blank 8 which functions as a crystal unit is encapsulated in first recess 20a. Further, second recess 20b at a lower side illustrated in the drawing is formed by central layer 21a and frame layer 21c, and IC chip 1 is housed in second recess 20b.

A pair of crystal holding terminals 12 are provided on an inner bottom surface of first recess 20a, that is, a surface of a front side of central layer 21a, and crystal blank 8 is fixed and held in first recess 20a by fixing lead electrodes to crystal holding terminals 12 with, for example, conductive adhesive 13 or the like at the positions where the pair of lead electrodes are led out, as in the case shown in FIGS. 1A and 1B. After fixing crystal blank 8, in the opening end surface of first recess 20a of container body 21, metal cover 9 is joined to metal ring 15 provided on a top surface of frame layer 21b by seam welding or the like, whereby crystal blank 8 is hermetically encapsulated in first recess 20a In container body 21, mounting terminals 4 which are used when the crystal oscillator is surface-mounted on a wiring board are respectively formed at four corner portions of the opening end surface of frame layer 21c forming second recess 20b. Further, on an inner bottom surface of second recess 20b, that is, a back surface of central layer 21a, a plurality of circuit terminals 11 are disposed to be along both long sides of central layer 21a as shown in FIG. 5. As in the above-described case, circuit terminals 11 are provided to correspond to IC terminals provided on IC chip 1. In the illustrated example, four circuit terminals 11 are provided in a line along each long side. Four of circuit terminals 11 correspond to, for example, a power source terminal, a ground terminal, an oscillation output terminal, and AFC terminal of the IC terminals, and are electrically connected to corresponding mounting terminals 4 by conductive paths (not shown) formed in central layer 21a. Further, two of remaining circuit terminals 11 are crystal circuit terminals 11a electrically connected to crystal blank 8. Crystal circuit terminals 11a are electrically connected to crystal holding terminals 12 provided on the inner bottom surface of first recess 20a through conductive paths (not shown) such as via holes provided in central layer 21a. Further, a pair of crystal inspection terminals X1, X2 are provided on the back surface of central layer 21a. Crystal inspection terminals X1, X2 are electrically connected to crystal circuit terminals 11a by a conductive pattern provided on the back surface of central layer 21a. Accordingly, crystal inspection terminals X1, X2 are electrically connected to crystal blank 8.

As IC chip 1, the one as described above is used. IC chip 1 is fixed to the bottom surface of second recess 20b by joining the IC terminals to circuit terminals 11, 11a provided on the bottom surface of second recess 20b by ultrasonic thermocompression bonding using bumps 6 by the method of so-called flip chip bonding.

When such a two-chamber type surface-mount crystal oscillator is manufactured, first, a crystal unit is configured by hermetically encapsulating crystal blank 8 in first recess 20a, and thereafter, probes for measurement are caused to abut on crystal inspection terminals X1, X2 which are provided on the bottom surface of second recess 20b, that is, the back surface of central layer 21a, whereby the vibration characteristic or the like of crystal blank 8 as a crystal unit is measured. At this time, the probes can be caused to abut on a pair of crystal inspection terminals X1, X2 from one direction, and operation efficiency of measurement of the vibration characteristic or the like becomes high. The crystal unit which has abnormality in the vibration characteristic or the like is discarded as a defective, and for the one which is determined as good, IC chip 1 is subsequently mounted on the bottom surface of second recess 20b. Protective resin layer 16 as underfill for protecting a circuit formation surface of IC chip 1 is further provided, and thereby, a crystal oscillator is completed. Japanese Patent Laid-Open No. 2000-49560 (JP-A-2000-49560), for example, describes disposing crystal inspection terminals on the bottom surface of the recess where the IC chip is to be mounted in the container body, and fixing the IC chip to the bottom surface of the recess after measurement of the oscillation characteristic or the like of the crystal blank in a two-chamber type crystal oscillator.

As a surface-mount crystal oscillator, there is a one-chamber type crystal oscillator in which by using a container body having one recess with a step portion formed on an inner wall, an IC chip is fixed to an inner bottom surface of the recess, and both sides of one end portion of a crystal blank where lead electrodes are extended are fixed to the step portion, whereby the crystal blank is disposed above the IC chip. In the one-chamber type crystal oscillator, the crystal blank is fixed after the IC chip is mounted on the bottom surface of the recess. Therefore, the IC chip cannot be mounted after measurement of the vibration characteristic of the crystal blank. The vibration characteristic is measured after the IC chip is mounted and the crystal blank is fixed.

Japanese Patent Laid-Open No. 2003-298000 (JP-A-2003-298000) discloses to form the terminals to be used for measurement of the vibration characteristic of a crystal blank, that is, the crystal inspection terminals, on an outer surface of the container body in a one-chamber type crystal oscillator.

In the above described bonding type surface-mount crystal oscillator, after the mounting substrate is joined to the crystal unit, external terminals 10(X) electrically connected to crystal blank 8 are not exposed to an outside, and therefore, the vibration characteristic of crystal blank 8 cannot be measured individually. Similarly, in the two-chamber type surface-mount crystal oscillator, after the IC chip is mounted, crystal inspection terminals X1, X2 are hidden by the IC chip, and therefore, the vibration characteristic of crystal blank 8 cannot be individually measured. However, in order to enhance reliability of the crystal oscillator and respond to request for high functionality, it is required to be able to measure the vibration characteristic of crystal blank 8 even after mounting substrate 2 loaded with IC chip 1 is joined to the bottom surface of crystal unit 3 in the case of a bonding type, or even after IC chip 1 is mounted on the bottom surface of the recess of container body 21 in the case of two-chamber type. More specifically, it is required to be able to measure the vibration characteristic of the crystal blank without passing through the IC chip when whether a product is good or bad is finally determined before shipment after completion of a crystal oscillator, and when failure analysis is performed for searching the cause of a trouble when the trouble occurs during use of a crystal oscillator.

SUMMARY OF THE INVENTION

An object of the present invention is to provide a quartz crystal device which does not impair operation efficiency of measurement of the vibration characteristic of a crystal blank in a manufacture process and is capable of measuring the vibration characteristic of the crystal blank even after being assembled.

The object of the present invention is attained by a quartz crystal device including a crystal monitor terminal electrically connected to a crystal blank on an outer side surface separately from an external terminal or a crystal inspection terminal used for measuring a vibration characteristic of the crystal blank in the manufacturing process.

A quartz crystal device of the present invention configured as a bonding type is characterized in that the device includes: a crystal unit having a container in which a crystal blank is hermetically encapsulated, and including an external terminal electrically connected to the crystal blank, the external terminal being provided on an outer bottom surface of the container; a mounting substrate including a bonding terminal on one principal surface and a mounting terminal on the other principal surface, and housing an IC chip on which a circuit using the crystal blank is integrated, the bonding terminal corresponding to the external terminal; and a crystal monitor terminal provided on an outer side surface of the mounting substrate and electrically connected to the bonding terminal. The device is further characterize in that, by joining the external terminal and the bonding terminal, the mounting substrate is joined to the crystal unit to be integrated with the crystal unit, and even in a state in which the crystal unit and the mounting terminal are integrated, a vibration characteristic of the crystal blank is measurable by using the crystal monitor terminal.

In this bonding type quartz crystal device, the crystal monitor terminal may be formed in a concave portion formed on the outer side surface of the mounting substrate. Further, the mounting substrate is configured by laminated ceramics configured by laminating ceramic sheets in a plurality of layers, and the crystal monitor terminal may be formed on a side surface of each ceramic sheet except for a layer which is the closest to the second principal surface side of the mounting substrate. Furthermore, the crystal monitor terminal may extensively exist on an outer side surface of the crystal unit.

According to these bonding type configurations, the vibration characteristic of the crystal blank can be directly measured by using the crystal monitor terminal provided on the outer side surface of the mounting substrate or the container body even after the mounting substrate housing the IC chip is joined to the crystal unit.

A quartz crystal device of the present invention configured as a two-chamber type is characterized in that the device includes: a container body having a first recess formed on one principal surface and a second recess formed on the other principal surface; a crystal blank hermetically encapsulated in the first recess; an IC chip which is housed in the second recess by being fixed to a bottom surface of the second recess, and on which a circuit using the crystal blank is integrated; a crystal inspection terminal provided at a position covered with the IC chip in the bottom surface of the second recess, and electrically connected to the crystal blank; and a crystal monitor terminal provided on an outer side surface of the container body, and electrically connected to the crystal blank. The device is further characterized in that even in a state in which the IC chip is fixed to the bottom surface of the second recess, a vibration characteristic of the crystal blank is measurable by using the crystal monitor terminal.

In this two-chamber type quartz crystal device, the crystal monitor terminal may be formed in a concave portion formed on the outer side surface of the container body, and the container body may be configured by laminated ceramics configured by laminating ceramic sheets in a plurality of layers.

According to these two-chamber type configurations, the vibration characteristic of the crystal blank can be directly measured by using the crystal monitor terminal provided on the outer side surface of the mounting substrate or the container body even after the IC chip is fixed to the bottom surface of the recess of the container body.

By applying the present invention, the vibration characteristic of the crystal blanks can be measured without passing through the IC chips, for example, when whether the products are good or not is determined before shipment after completion of the crystal oscillators, or when failure analysis for searching the cause of a trouble is performed when the trouble occurs during use of the crystal oscillators.

DETAILED DESCRIPTION OF THE PREFERRED EMBODIMENTS

First Embodiment

In FIGS. 6A, 6B, 7A and 7B showing a quartz crystal device according to a first embodiment of the present invention, the same components as those in FIGS. 1A, 1B, 2A, 2B, 3, 4A, 4B and 5 are assigned with the same reference numerals, and the redundant description of them will be omitted or simplified.

A surface-mount crystal oscillator of the first embodiment is similar to the conventional bonding type surface-mount crystal oscillator shown in FIGS. 1A, 1B, 2A and 2B, but differs from the conventional one in the point that crystal monitor terminals 22 are provided on outer side surfaces of mounting substrate 2.

Figure 6A:
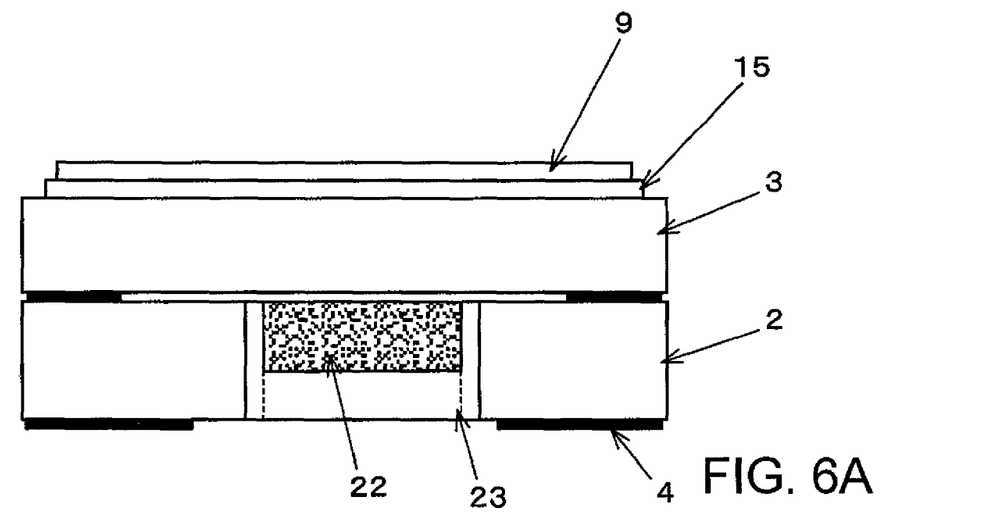
FIGS. 6A and 6B are a side view and an assembled sectional view, respectively, showing a configuration of a surface-mount crystal oscillator according to a first embodiment of the present invention.
Figure 6B:
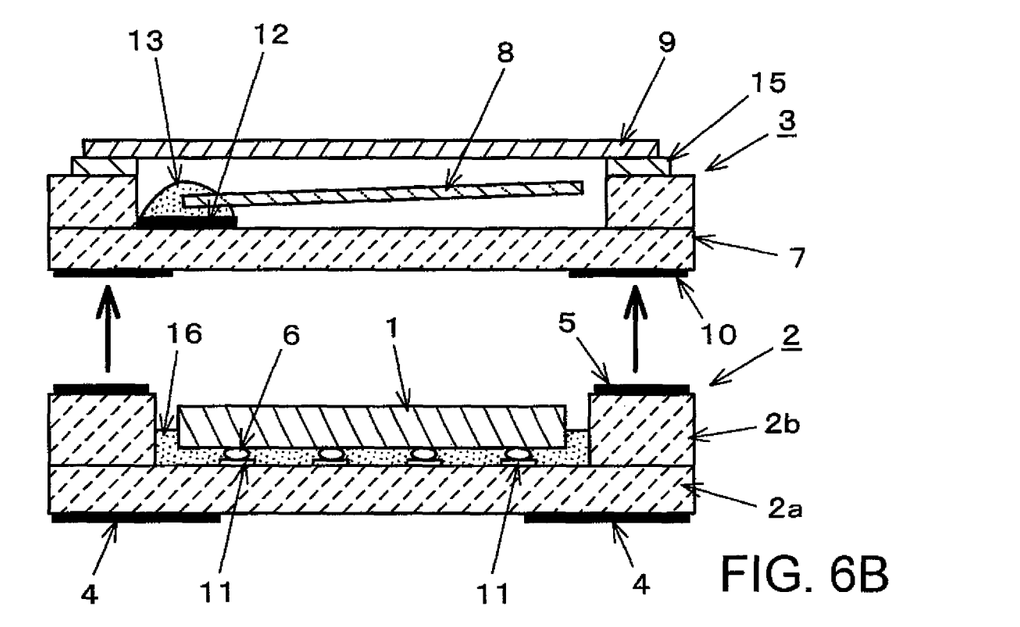
Figure 7A:
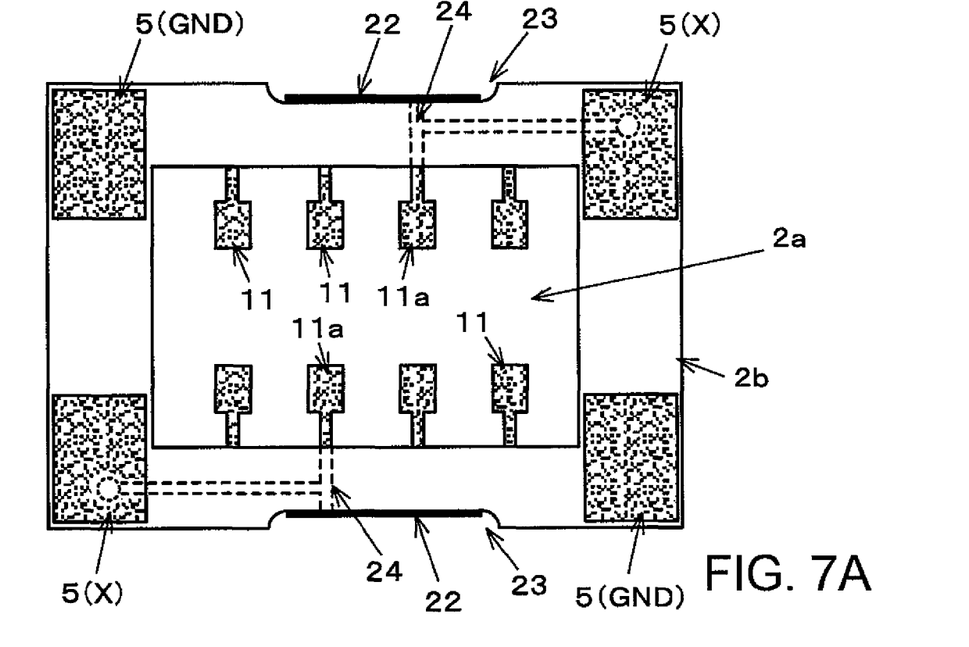
FIGS. 7A and 7B are a top view and a bottom view of a mounting substrate in the crystal oscillator of the first embodiment, respectively.
Figure 7B:
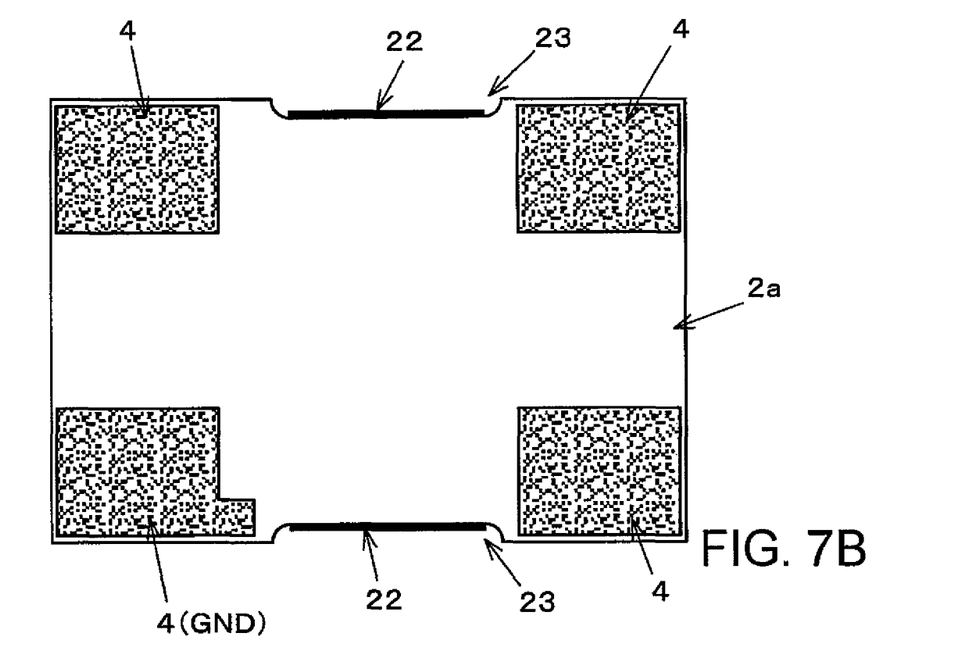

Of four outer side surfaces of mounting substrate 2 having a substantially rectangular planar shape, in central portions of a pair of outer side surfaces opposed to each other along long sides of mounting substrate 2, concave portions 23 each with a section in the shape of a pan bottom are formed to connect a bottom surface and a top surface of mounting substrate 2. Each of concave portions 23 is formed in a region interposed between mounting terminals 4 which are provided respectively at both end portions of the side of the bottom surface, when seen from the bottom surface side of mounting substrate 2, as shown in FIG. 7B. In such concave portion 23, at a position corresponding to a side surface of frame wall layer 2b, crystal monitor terminal 22 is formed. Crystal monitor terminal 22 is not formed at the position corresponding to a side surface of bottom wall layer 2a. This is because if crystal monitor terminal 22 is formed at a position corresponding to the side surface of bottom wall layer 2a, there occurs the fear of crystal monitor terminal 22 and a circuit pattern on a wiring board being electrically contact each other unexpectedly when the crystal oscillator is mounted on the wiring board. When bottom wall layer 2a itself is also configured by ceramic sheets in a plurality of layers in mounting substrate 2 configured by laminated ceramics, crystal monitor terminal 22 may be also formed on a side surface of a ceramic sheet of each layer except for the ceramic sheet to be the lowest bottom surface of mounting substrate 2, so that in concave portion 23, crystal monitor terminal 22 is formed to extend to the side surface of bottom wall layer 2a from the side surface of frame wall layer 2b, and the electrode area of crystal monitor terminal 22 becomes large. When the problem of the fear of electrical contact with the circuit pattern on a wiring board or the like does not occur, crystal monitor terminal 22 may be formed on the side surface of the lowermost layer portion of bottom wall layer 2a.

Such concave portion 23 and crystal monitor terminal 22 are formed by performing through-hole machining and through-hole plating processing to the machined surface when mounting substrate 2 is formed by laminating and firing ceramic green sheets corresponding to bottom wall layer 2 and frame wall layer 2b.

Crystal monitor terminals 22 formed on a pair of outer side surfaces which opposed to each other of mounting substrate 2 are electrically connected to a pair of circuit terminals 11a corresponding to crystal connection terminals of IC chip 1 out of circuit terminals 11 formed on an inner bottom surface of a recess of mounting substrate 2, that is, a top surface of bottom wall layer 2a, through conductive paths 24 as shown by the broken lines in FIG. 7B. Conductive paths are formed on a lamination plane between frame wall layer 2b and bottom wall layer 2a. Circuit terminals 11a are also connected to bonding terminals 5(X) formed at corner portions of a top surface of frame wall layer 2b, and as a result, a pair of crystal monitor terminals 22 are electrically connected to a pair of bonding terminals 5(X).

Such a bonding type surface-mount crystal oscillator of the first embodiment is assembled by independently forming mounting substrate 2 loaded with IC chip 1 and crystal unit 3, and thereafter, joining both of them. On this occasion, before mounting substrate 2 is joined to the bottom surface of crystal unit 3, probes of a measuring apparatus are caused to abut on a pair of external terminals 10(X) formed on an outer bottom surface of container body 7 of crystal unit 3, a vibration characteristic of crystal blank 8 is measured, whether the crystal unit is good or not is determined, and thereafter, mounting substrate 2 is joined to only good crystal unit 3 to complete a crystal oscillator.

In the crystal oscillator, access cannot be got from an outside to external terminals 10(X) which are electrically connected to crystal blank 8, after completion of the crystal oscillator, but instead, crystal monitor terminals 22 are electrically connected directly to crystal blank 8. Therefore, by causing the probes for measurement to abut on crystal monitor terminals 22, the vibration characteristic of crystal blank 8 can be measured. Accordingly, in the surface-mount crystal oscillator, when whether the product is good or not is finally determined before shipment, and when failure analysis for search of the cause of a trouble is performed when the trouble occurs during use of the crystal oscillator, the vibration characteristic of the crystal blank can be measured without passing through the IC chip.

Second Embodiment

Figure 8:
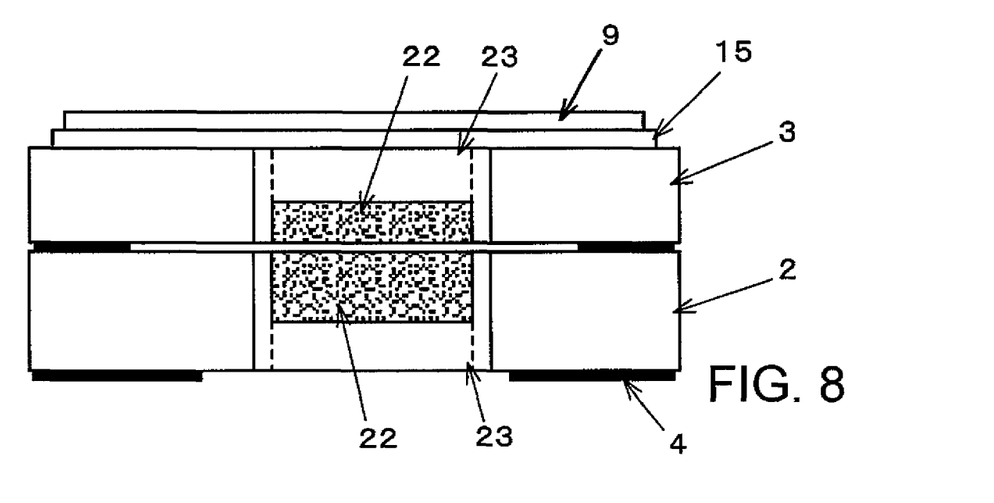
FIG. 8 is a side view showing a configuration of a surface-mount crystal oscillator according to a second embodiment of the present invention.

Next, a surface-mount crystal oscillator which is a quartz crystal device according to a second embodiment of the present invention will be described. In the above described first embodiment, in the bonding type surface-mount crystal oscillator, crystal monitor terminals 22 are provided at only the outer side surfaces of mounting substrate 2 which houses IC chip 1, but in order to enlarge an area of crystal monitor terminals 22 to make it easy for probes to abut on them, crystal monitor terminals 22 can be also formed on the outer side surfaces of crystal unit 3. The crystal oscillator of the second embodiment shown in FIG. 8 is such that crystal monitor terminals 22 are also disposed at the outer side surfaces of crystal unit 3 in the crystal oscillator of the first embodiment. In FIG. 8, the same components as those in FIGS. 6A, 6B, 7A and 7B are assigned with the same reference numerals, and the redundant description of them will be omitted or simplified.

In the second embodiment, concave portions 23 are also formed on the outer side surfaces of crystal unit 3 so that concave portions 23 on the outer side surfaces of mounting substrate 2 directly extend, and crystal monitor terminals 22 are also provided in concave portions 23 in the regions at the outer side surfaces of crystal unit 3. Crystal monitor terminals 22 in crystal unit 3 are electrically connected to external terminals 5(X) of crystal unit 3 through conductive paths (not shown) formed in a bottom surface of crystal unit 3, for example. Container body 7 of crystal unit 3 is formed of laminated ceramics, and concave portions 23 are formed to connect a top surface and a bottom surface of container body 7. In order to avoid electrical contact with metal cover 9, crystal monitor terminals 22 are formed on side surfaces of the respective layers except for the uppermost layer out of ceramic sheets in a plurality of layers configuring container body 7 in concave portions 23 of container body 7. Here, the uppermost layer of the ceramic sheets means the layer which is the closest to the top surface of container body 7. Concave portion 23 and crystal monitor terminal 22 are formed by performing through-hole machining and through-hole plating when the ceramic green sheets are laminated and fired to form container body 7 as in the case of mounting substrate 2.

In the second embodiment, before mounting substrate 2 loaded with IC chip 1 is joined to the bottom surface of crystal unit 3, probes of a measuring apparatus is caused to abut on a pair of external terminals 10(X) formed on an outer bottom surface of container body 7 of crystal unit 3, the vibration characteristic or the like of crystal blank 8 is measured, whether the crystal unit is good or not is determined, and thereafter, mounting substrate 2 is joined to only good crystal unit 3 to complete the crystal oscillator. On this occasion, since crystal monitor terminals 22 are also already formed on the outer side surface of crystal unit 3, the vibration characteristic of crystal blank 8 can be measured by using the crystal monitor terminals, but the probes have to be caused to abut on a pair of crystal monitor terminals 22 in such a manner that the probes nip them form the two opposite directions, and therefore, operability becomes worse as compared with the case in which probes are caused to abut on a pair of external terminals 10(X) from one direction The surface-mount crystal oscillator of the second embodiment has the advantage of being capable of measuring the vibration characteristic of a crystal blank without passing through the IC chip, when whether the product is good or not is finally determined before shipment, or failure analysis for search of the cause of a trouble is performed when the trouble occurs during use of the crystal oscillator, as in the crystal oscillator of the first embodiment. Further, the crystal oscillator of the second embodiment has the advantage of easily causing probes to abut on crystal monitor terminals 22 as compared with the one of the first embodiment since crystal monitor terminals 22 are also formed on the outer side surfaces of crystal unit 3. When mounting substrate 2 is joined to crystal unit 3, a space of about 50 µm is formed between both of them, and a slit having a width of about the same value as this is formed in each of crystal monitor terminals 22, but the slit of this width is sufficiently small as compared with the dimension of the tip end of the probe, and therefore, does not become a trouble for measuring the vibration characteristic.

Third Embodiment

Figure 9:
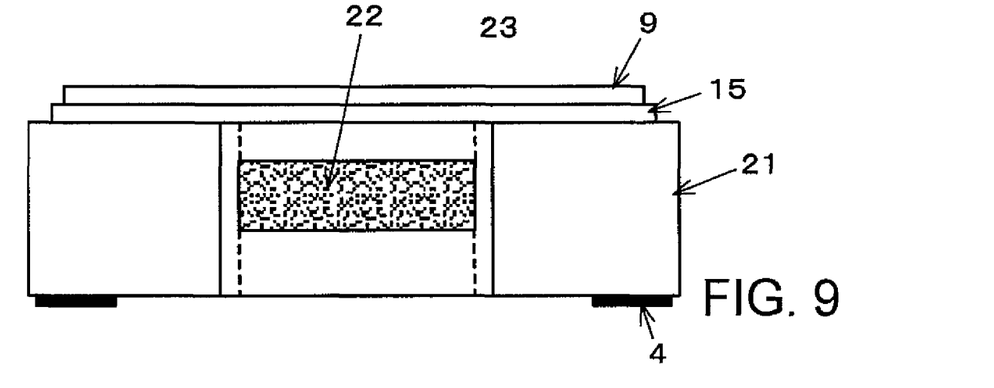
FIG. 9 is a side view showing a configuration of a surface-mount crystal oscillator according to a third embodiment of the present invention.
Figure 10:
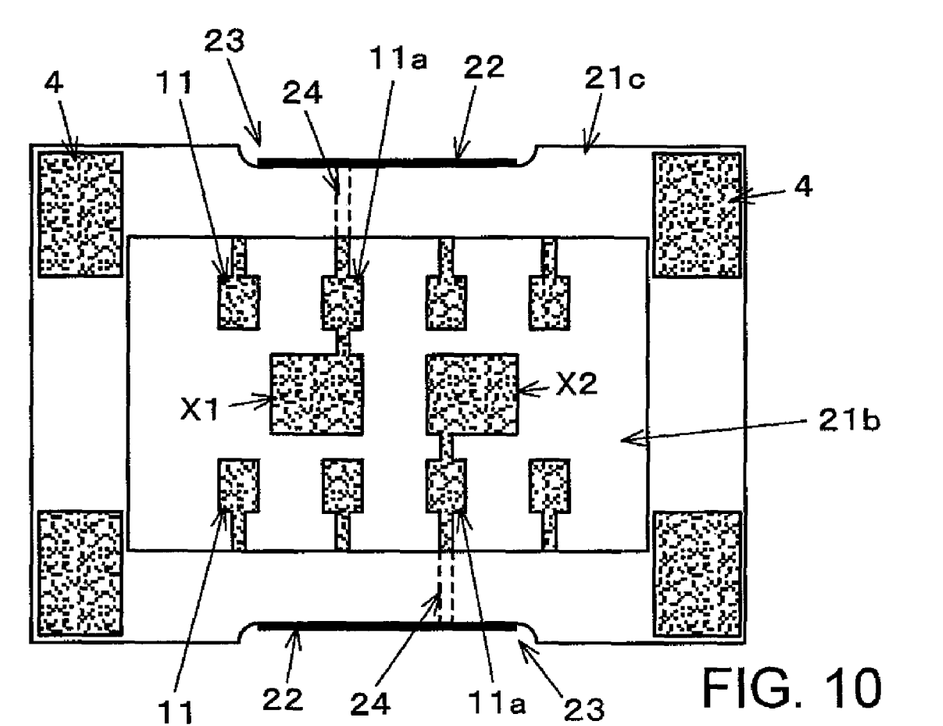
FIG. 10 is a bottom view of a container body in the crystal oscillator of the third embodiment with an IC chip removed.

Next, a surface-mount crystal oscillator which is a quartz crystal device according to a third embodiment of the present invention will be described. In the first and second embodiments, the present invention is applied to the bonding type surface-mount crystal oscillator, but the present invention can be also applied to a two-chamber type surface-mount crystal oscillator. The third embodiment is an example of application of the present invention to a two-chamber type surface-mount crystal oscillator. FIG. 9 is a side view showing a surface-mount crystal oscillator of the third embodiment. FIG. 10 is a bottom view of a container body in this crystal oscillator with an IC chip removed. In these drawings, the same components as those shown in FIGS. 4A, 4B and 5 are assigned with the same reference numerals, and the redundant description of them will be omitted or simplified.

The surface-mount crystal oscillator of the third embodiment is similar to the conventional two-chamber type surface-mount crystal oscillator shown in FIGS. 4A, 4B and 5, but differs from the conventional one in the point that crystal monitor terminals 22 are provided on an outer side surface of container body 21.

As the one shown in FIGS. 4A, 4B and 5, container body 21 with a substantially rectangular planar shape is configured by laminated ceramics in which frame layers 21b and 21c are respectively laminated on a top surface and an undersurface of central layer 21a. Of four outer side surfaces of container body 21, in central portions of a pair of outer side surfaces opposed to each other along long sides of container body 21, concave portions 23 each with a section in the shape of a pan bottom are respectively formed to connect an upper end surface and a bottom surface of container body 21. Crystal monitor terminals 22 are provided in concave portions 23 as in the first and second embodiments. Each crystal monitor terminal 22 is formed at a position corresponding to a side surface of a ceramic sheet of each layer except for the ceramic sheets corresponding to the lowest bottom surface and the uppermost surface in container body 21 configured by laminating and firing the ceramic green sheets in a plurality of layers. The ceramic sheet corresponding to the lowest bottom surface means the ceramic sheet which is in contact with a wiring board. Crystal monitor terminals 22 are electrically connected to crystal circuit terminals 11a through conductive paths 24 formed in a lamination plane between central layer 21a and frame layer 21c. In the drawing, conductive paths 24 are shown by the broken lines. Crystal circuit terminals 11a are also electrically connected to crystal blank 8, and therefore, crystal monitor terminals 22 are electrically connected to crystal blank 8.

When the two-chamber type surface-mount crystal oscillator of this embodiment is manufactured, a crystal unit is configured by hermetically encapsulating crystal blank 8 in first recess 20*a*, after which, probes for measurement are caused to abut on a pair of crystal inspection terminals X1, X2 provided on the bottom surface of second recess 20*b*, whereby, the vibration characteristic or the like of crystal blank 8 as a crystal unit is measured, and whether the crystal unit is good or not is determined. For the one which is determined as good, IC chip 1 is mounted on the bottom surface of second recess 20*b* next, and thereby, the crystal oscillator is completed. When the vibration characteristic of crystal blank 8 needs to be measured after the crystal oscillator is completed, the vibration characteristic can be directly measured by causing probes to abut on crystal monitor terminals 22 instead of crystal inspection terminals X1, X2.

What is claimed is:

1. A quartz crystal device, comprising:
    a container body having a first recess formed on one principal surface and a second recess formed on the other principal surface;
    a crystal blank hermetically encapsulated in said first recess;
    a circuit terminal in the bottom surface of said second recess electrically connected said crystal blank;
    an IC chip which is housed in said second recess by being fixed to a bottom surface of said
    a crystal inspection terminal provided at a position covered with said IC chip in the bottom surface of said second recess, and electrically connected to said crystal blank through said circuit terminal; and
    a crystal monitor terminal formed on an outer side surface of said container body, and electrically connected to said crystal blank, wherein even in a state in which said IC chip is fixed to the bottom surface of said second recess, a vibration characteristic of said crystal blank is measurable by using said crystal monitor terminal.

2. The device according to claim 1, wherein said crystal monitor terminal is formed in a depressed portion formed on the outer side surface of said container body.

3. The device according to claim 1, wherein said container body comprises laminated ceramics configured by laminating ceramic sheets in a plurality of layers.

4. The device according to claim 1, wherein said circuit is an oscillating circuit using said crystal blank, and said device is configured as a surface-mount crystal oscillator.

5. The device according to claim 1, wherein a plurality circuit terminals electrically and mechanically connecting to the IC chip are disposed on the bottom surface of the second recess and the crystal inspection terminal is separately disposed on the bottom surface of the second recess from the plurality of the circuit terminals.

6. The device according to claim 5, wherein a pair of the crystal inspection terminals are provided on the bottom surface of the second recess and a pair of the crystal monitor terminals are provided on the outer side surface of the container body.

7. The device according to claim 6, wherein each of said crystal monitor terminals is formed in a depressed portion formed on the outer side surface of said container body.

8. The device according to claim 6, wherein said container body comprises laminated ceramics configured by laminating ceramic sheets in a plurality of layers.

9. The device according to claim 6, wherein said circuit is an oscillating circuit using said crystal blank, and said device is configured as a surface-mount crystal oscillator.

* * * * *